(12) United States Patent
Lu et al.

(10) Patent No.: US 8,458,631 B2
(45) Date of Patent: Jun. 4, 2013

(54) CYCLE TIME REDUCTION IN DATA PREPARATION

(75) Inventors: Chi-Ta Lu, Sanxing Township, Yilan County (TW); Jia-Guei Jou, New Taipei (TW); Peng-Ren Chen, Hsinchu (TW); Dong-Hsu Cheng, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/207,691

(22) Filed: Aug. 11, 2011

(65) Prior Publication Data

US 2013/0042210 A1 Feb. 14, 2013

(51) Int. Cl.
*G06F 17/50* (2006.01)

(52) U.S. Cl.
USPC .......................................................... 716/110

(58) Field of Classification Search
USPC ................................. 716/100, 110
See application file for complete search history.

(56) References Cited

U.S. PATENT DOCUMENTS

| | | | | |
|---|---|---|---|---|
| 7,546,564 | B2* | 6/2009 | Moon | 716/53 |
| 8,144,556 | B2* | 3/2012 | Fuse et al. | 369/47.53 |
| 2002/0026626 | A1* | 2/2002 | Randall et al. | 716/19 |
| 2005/0076316 | A1* | 4/2005 | Pierrat et al. | 716/4 |
| 2005/0216875 | A1* | 9/2005 | Zhang et al. | 716/9 |
| 2007/0055953 | A1* | 3/2007 | Fang et al. | 716/19 |
| 2007/0067752 | A1* | 3/2007 | Moon | 716/21 |
| 2008/0295059 | A1* | 11/2008 | Choi | 716/19 |
| 2010/0185999 | A1* | 7/2010 | Graur et al. | 716/20 |
| 2011/0173578 | A1* | 7/2011 | Tsai et al. | 716/55 |
| 2012/0047479 | A1* | 2/2012 | Paris et al. | 716/112 |
| 2012/0167020 | A1* | 6/2012 | Abd El Wahed et al. | 716/53 |
| 2012/0317524 | A1* | 12/2012 | Taoka | 716/53 |

* cited by examiner

*Primary Examiner* — Suchin Parihar
(74) *Attorney, Agent, or Firm* — Haynes and Boone, LLP

(57) ABSTRACT

The present disclosure provides for methods of reducing cycle time in data preparation. In one embodiment, a method includes receiving an initial integrated circuit (IC) design layout and an optical proximity correction (OPC)-processed initial IC design layout, and receiving a revised IC design layout. The method further includes comparing the revised IC design layout to the initial IC design layout to identify a difference region of the revised IC design layout from the initial IC design layout, performing an OPC on the difference region of the revised IC design layout, and merging the OPC-processed difference region of the revised IC design layout with the OPC-processed initial IC design layout.

20 Claims, 8 Drawing Sheets

CYCLE TIME REDUCTION IN DATA PREPARATION

BACKGROUND

In semiconductor manufacturing technology, circuit designs, structure and layouts (generically referred to as "patterns") are typically designed and stored in one or more data files. The data files are then provided to a "writer". A writer is a device used to convert the data file to an image on a substrate, such as a mask (reticle) or a semiconductor wafer.

It is well known that in semiconductor manufacturing technology, patterns are becoming increasingly complex. This can be a result of various items, including a reduced critical-dimension (CD) for the images, larger image size, and more intricate patterns. As a result, the size of the corresponding data file(s) also increases. This leads to a longer data preparation cycle as node size decreases. This provides many different drawbacks, including increased delay, possibility for error, and computational requirements.

Therefore, a need exists for a method that reduces data preparation requirements. In this way, preparation of mask or wafer data files may be more efficient and less investment is needed.

SUMMARY

The present disclosure provides for many different embodiments. According to one embodiment, a method of reducing cycle time in data preparation is provided. The method includes receiving an initial integrated circuit (IC) design layout and an optical proximity correction (OPC)-processed initial IC design layout, and receiving a revised IC design layout. The method further includes comparing the revised IC design layout to the initial IC design layout to identify a difference region of the revised IC design layout from the initial IC design layout, performing an OPC on the difference region of the revised IC design layout, and merging the OPC-processed difference region of the revised IC design layout with the OPC-processed initial IC design layout.

In another embodiment, a method includes receiving an initial integrated circuit (IC) design layout and an optical proximity correction (OPC)-processed initial IC design layout, and receiving a revised IC design layout. The method further includes comparing the revised IC design layout to the initial IC design layout by an exclusive or (XOR) logical operation to identify a difference region of the revised IC design layout from the initial IC design layout, performing an OPC on the difference region of the revised IC design layout, merging the OPC-processed difference region of the revised IC design layout with the OPC-processed initial IC design layout to provide a merged OPC-processed revised IC design layout, and fracturing the merged OPC-processed revised IC design layout.

In yet another embodiment, a non-transitory computer-readable medium having instructions embodied thereon is provided. The instructions are executable by a processor to perform a method comprising: receiving an initial integrated circuit (IC) design layout and an optical proximity correction (OPC)-processed initial IC design layout; receiving a revised IC design layout; comparing the revised IC design layout to the initial IC design layout to identify a difference region of the revised IC design layout from the initial IC design layout; performing an OPC on the difference region of the revised IC design layout; and merging the OPC-processed difference region of the revised IC design layout with the OPC-processed initial IC design layout.

BRIEF DESCRIPTION OF THE DRAWINGS

Aspects of the present disclosure are understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
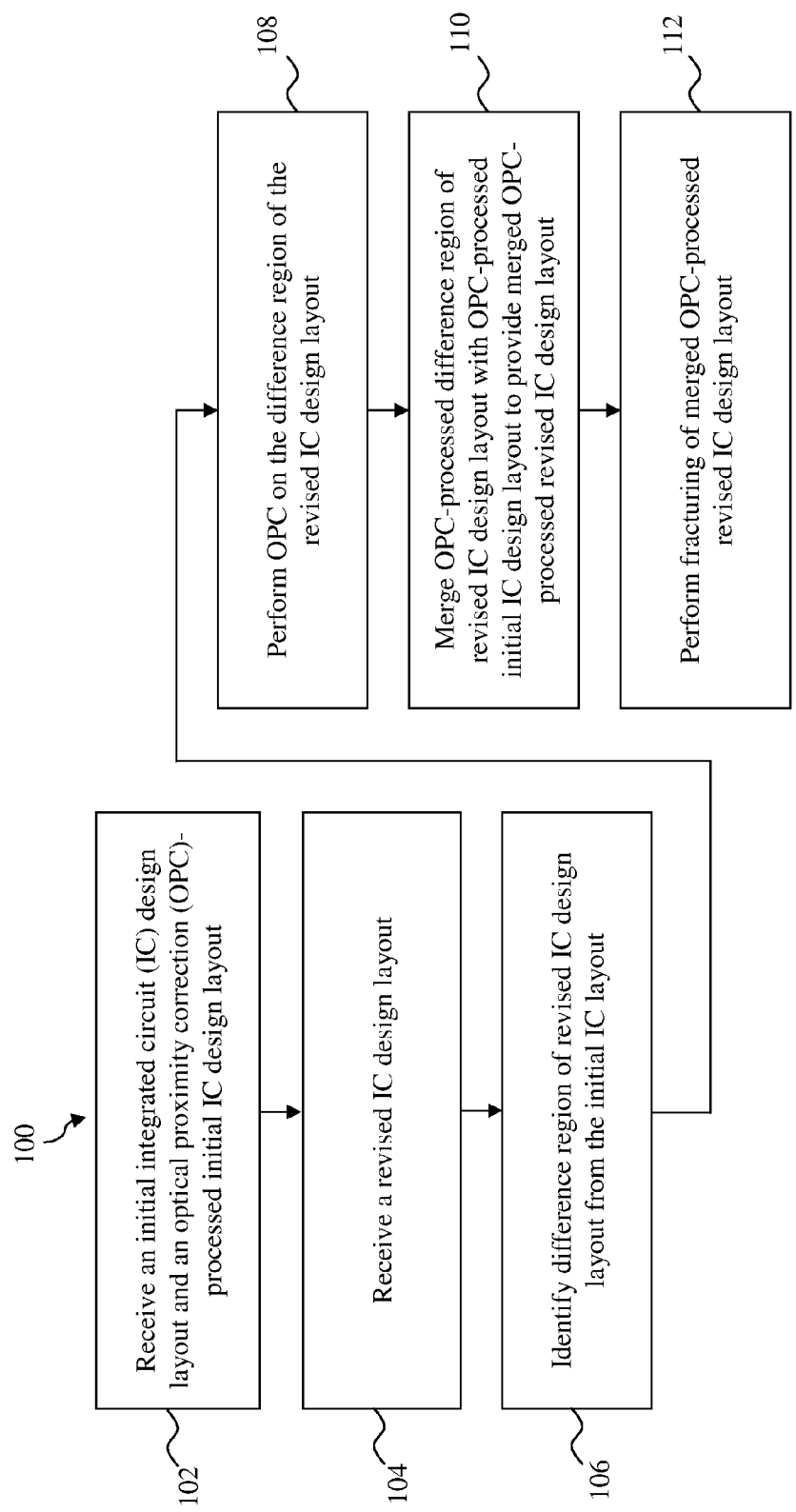
FIG. 1 is a flowchart illustrating a method for reducing cycle time in data preparation in accordance with embodiments of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first", "second", "third", and so on, may be used herein to describe various gate dielectric layers, gate electrode layers, and/or other layers, the gate dielectric layers, the gate electrode layers, and/or other layers should not be limited by these terms. These terms are only used to distinguish one layer from another layer. Thus, a first layer discussed below could be termed a second layer and vice versa without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1, a flowchart is shown illustrating a method 100 for reducing cycle time in IC mask data preparation. Method 100 includes, at block 102, receiving an initial integrated circuit (IC) design layout and an optical proximity correction (OPC)-processed initial IC design layout. Method 100 further includes, at block 104, receiving a revised IC design layout, and at block 106, comparing the revised IC design layout to the initial IC design layout to identify a difference region of the revised IC design layout from the initial IC design layout. Method 100 further includes, at block 108, performing an OPC on the difference region of the revised IC design layout, and at block 110, merging the OPC-processed difference region of the revised IC design layout with the OPC-processed initial IC design layout to provide a merged OPC-processed revised IC design layout. Method 100 further includes, at block 112, performing a fracturing process on the merged OPC-processed revised IC design layout.

The various steps in method 100 described above may be performed by various techniques, means, apparatus, and/or systems. It should be noted that the operations of method 100 may be rearranged or otherwise modified within the scope of the various aspects of the present disclosure. It is further noted that additional processes may be provided before, during, and after the operations of method 100, and that some other processes may only be briefly described herein. Thus, other implementations are possible within the scope of the various aspects described herein.

According to one aspect of the present disclosure, the revised IC design layout is compared to the initial IC design layout by an exclusive or (XOR) logical operation to identify the difference region. In one embodiment, the difference region of the revised IC design layout may include a boundary patch that includes portions of the initial IC design layout to avoid gaps when merging the OPC-processed difference region.

According to another aspect of the present disclosure, the OPC performed on the difference region of the revised IC design layout is a rule-based OPC, a model-based OPC, or a combination thereof.

According to yet another aspect of the present disclosure, method 100 may further include determining a ratio of an area of the difference region and an area of the revised IC design layout, and then performing the OPC on the difference region of the revised IC design layout only if the ratio is below a threshold (e.g., a specified percentage).

According to yet another aspect of the present disclosure, method 100 may further include identifying a difference region of the initial IC design layout from the revised IC design layout, and removing the difference region of the initial IC design layout from the OPC-processed initial IC design layout.

According to yet another aspect of the present disclosure, method 100 may further include performing an alignment check of a boundary patch of the merged difference region of the revised IC design layout, and performing a lithographic process check of the boundary patch.

Figure 2:
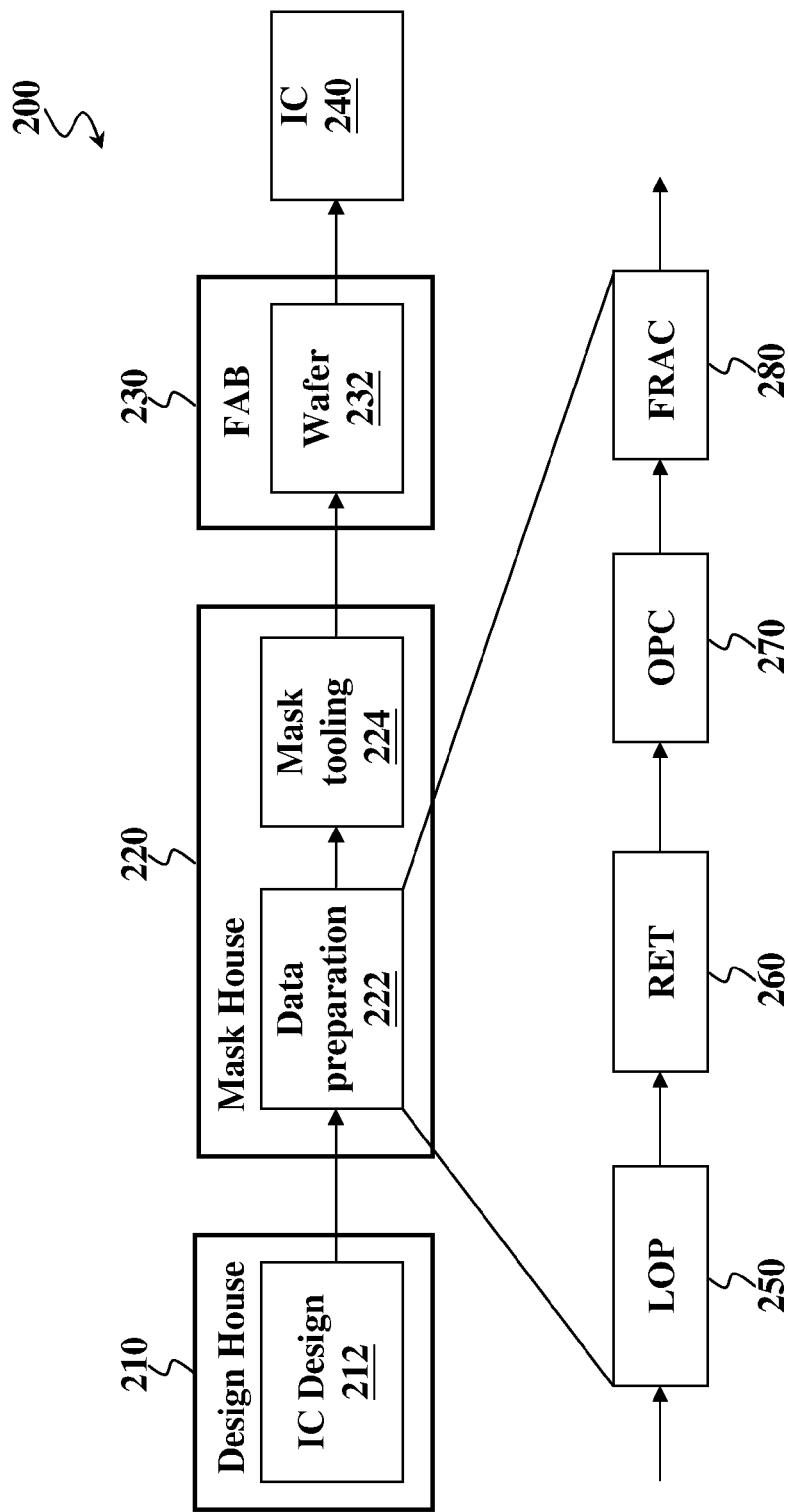
FIG. 2 is a simplified block diagram of an embodiment of an integrated circuit (IC) manufacturing system and an associated IC manufacturing flow.

Referring now to FIG. 2, a simplified block diagram illustrates an embodiment of an integrated circuit (IC) manufacturing system 200 and an IC manufacturing flow associated with the IC manufacturing system 200. The IC manufacturing system 200 includes a plurality of entities, such as a design house 210, a mask house 220, and an IC manufacturer 230, that interact with one another in the design, development, and manufacturing cycles and/or services related to manufacturing an integrated circuit (IC) device 240. The plurality of entities may be connected by a communications network, which may be a single network or a variety of different networks, such as an intranet and the Internet, and may include wired and/or wireless communication channels. Each entity may interact with other entities and may provide services to and/or receive services from the other entities. The design house 210, mask house 220, and IC manufacturer 230 may be a single entity or separate entities.

In one example, a customer may provide an IC for manufacture. A tape-out process may include a floor planning process in which the various structures making up the IC are provided in a design layout (or database). The process may include generating an electronic file of the design layout in a GDS format. The design layout GDS file is checked by a design rule check (DRC) tool to ensure the design layout complies with various design rules such as a minimum density rule. It is understood that other types of file formats may be also be used in this example. The process continues with an assembly process. The circuit design may be partitioned into various blocks, each block performing a specific function. Accordingly, the various blocks are assembled together and the entire design layout (or database) is ready for photomask (or mask) processing.

The design house (or design team) 210 generates an IC design layout 212. The IC design layout 212 includes various geometrical patterns designed for an IC product, based on a specification of the IC product to be manufactured. The geometrical patterns correspond to patterns of metal, oxide, or semiconductor layers that make up the various components of the IC device 240 to be fabricated. The various layers combine to form various IC features. For example, a portion of the IC design layout 212 may include various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 210 implements a proper design procedure to form the IC design layout 212. The design procedure may include logic design, physical design, and/or place and route. The IC design layout 212 is presented in one or more data files having information of the geometrical patterns. For example, the IC design layout 212 can be expressed in a GDSII file format (or DFII file format).

The mask house 220 uses the IC design layout 212 to manufacture one or more masks to be used for fabricating the various layers of the IC product according to the IC design layout 212. The mask house 220 performs mask data preparation 222, where the IC design layout 212 is translated into a form that can be physically written by a mask writer, and mask tooling 224, where the design layout prepared by the mask data preparation 222 is modified to comply with a particular mask writer and/or mask manufacturer. In the present embodiment, the mask data preparation 222 and mask tooling 224 are illustrated as separate elements, however, the mask data preparation 222 and mask tooling 224 can be collectively referred to as mask data preparation, which can further include mask fabrication. A number of mask images may be generated based on the finished design layout. The number of mask images will vary depending on the complexity of the design layout. The process is now in a tape-out stage which represents when the design layout (or database) is ready for the chip manufacture.

The mask data preparation 222 includes a logic operation (LOP) 250, a retarget process (RET) 260, an optical proximity correction (OPC) 270, and a fracturing process (FRAC) 280.

The LOP 250 is performed on the IC design layout 212 to modify the IC design layout 212 according to manufacturing rules. For example, the conversion process may be implemented by software in LOP 250. Various manufacturer modules convert manufacturing constraints into a set of rules that the IC design layout 212 has to meet. If the IC design layout 212 does not meet this set of rules, the IC design layout 212 will be modified accordingly until the modified IC design layout meets these rules. Such modification is implemented by the logic operation 250.

RET 260 and OPC 270 are resolution enhancement techniques. RET 260 can modify the IC design layout 212 to compensate for limitations in lithographic processes used to manufacture the IC product according to the IC design layout 212. OPC 270 is a lithography enhancement technique used to compensate for image errors, such as those that can arise from diffraction, interference, or other process effects. RET 260 and OPC 270 features, such as scattering bars, serif, and/or hammerheads, are added to the IC design layout 212 according to optical models or rules such that, after a lithography process, a final pattern on a wafer is improved with enhanced resolution and precision. The mask data preparation 222 can include further resolution enhancement techniques, such as off-axis illumination, sub-resolution assist features, phase-shifting masks, other suitable techniques, or combinations thereof.

OPC 270 accounts for distortion in the pattern transfer process with modification of the design shapes in order to print the desired images on the wafer. OPC 270 may include general modifications for the limitation in the lithography process, and in one particular example accounts for the case of optical lithography. OPC 270 may include modifications of the design image account for optical limitations as well as mask fabrication limitations and resist limitations. Modifications of the design image can also account for the subsequent process steps like dry etching or implantation. It can also account for flare in the optical system as well as pattern density variations. Another application of proximity effect correction is the compensation of the effects of aberrations of the optical system used to print the image of the mask onto the wafers.

The OPC processing to the IC design layout can be applied using a rule-based approach or a model-based approach. For a rule-based approach (Rule-based OPC), the displacement of the segments would be set by a list of rules depending, for example, on the feature size and its environment. For a model-based approach (Model-based OPC), the printed image on the wafer would be simulated using a model of the pattern transfer process. The correction would be set such that the simulated image matches the desired wafer image. A combination of rule-based OPC and model-based OPC sometimes referred to as hybrid OPC can also be used.

In one example, the image quality can be improved by adding printing or non-printing assist features along the edges of the main features. These assist features modify the diffraction spectrum of the pattern in a way that improves the printing of the main feature. The practical implementation of assist features is enhanced with the use of proximity effect correction as described above to correct for any optical printing artifact as well as resist and etch artifacts.

FRAC 280 performs a fracturing process on the RET-processed and OPC-processed IC design layout (which may also be referred to as a modified IC design layout) to convert to a writer format (e.g., ebeam format). The fracturing process is performed on the data files to "fracture" the design features into polygons or other structures suitable for mask production. In one embodiment, the fracturing process creates temporary files, which are individual files created by individual machines that are batched to the host machine for merging. The process may further include merging the temporary files into a single file and converting the single file into a flat poly format. The flat poly format is a format used by an electronic design and analysis (EDA) tool, for example, a Synopsys® tool. At mask tooling 224, a "write-file" process converts data from the fracture process (a flat poly format) into a unique file format used by different writers, for example, a vsb12 format of Toshiba Corporation.

Data preparation may further include other processes, including but not limited to various pre-OPC and post-OPC processes. In one example, post-OPC processes include but are not limited to a lithographic process check (LPC) that simulates processing that will be implemented by the IC manufacturer 230 to fabricate the IC device 240, and various quality assurance processes (e.g., difference region alignment quality assurance and LPC check of boundary regions, XOR, CRC). LPC may simulate this processing based on the modified IC design layout to create a simulated manufactured device, such as the IC device 240. The simulated manufactured device may be all or a portion of the IC design layout. In the present embodiment, the LPC may simulate processing of the modified IC design layout, which has been subjected to the LOP 250, RET 260, OPC 270, and FRAC 280.

LPC may use one or more LPC models (or rules). The LPC models (or rules) may be based on actual processing parameters of the IC manufacturer 230. The processing parameters can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error sensitivity ("MEEF"), other suitable factors, or combinations thereof.

LPC may use the simulated manufactured device to inspect the IC design layout 212, or more specifically, the modified IC design layout, for hot spots. Hot spots refer to characteristics of the IC device that negatively affect the device's performance. Examples of hot spots include pinching/necking, bridging, dishing, erosion, RC delay, line thickness variations, Cu residue, and other characteristics. Hot spots can arise from the circuit design and/or process controls, and may be caused by numerous factors including but not limited to layout design, processing controls, inadequate line spacing, dishing, erosion, line thickness variations, and/or the presence of Cu residue.

LPC may detect hot spots by determining whether the simulated manufactured device complies with a set of hot spot rules. This is achieved by comparing parameters of the simulated manufactured device with a plurality of hot spot rules and/or specifications. The hot spot rules/specifications can be stored in a database accessible by the LPC. The hot spot rules may be organized based on processing type, layout designs, feature sizes, and/or other appropriate groupings. The hot spot rules can be predefined, or alternatively, are definable. Exemplary hot spot rules include a minimum density rule, a minimum line spacing rule, RC characteristic parameters, and other suitable hot spot rules. LPC may determine whether the simulated manufactured device violates any of the plurality of hot spot rules. If the simulated manufactured device satisfies the hot spot rules, the mask data preparation may be completed, and the IC design layout 212, more particularly, the modified IC design layout undergoes further processing in the mask tooling 224. Alternatively, the modified IC design layout is subjected to further model-based testing, rule-based testing, and/or otherwise modified or tested to further improve the design and/or layout of the device before the manufacturing phase.

After mask data preparation 222 and mask tooling 224, a mask or group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

The IC manufacturer 230, such as a semiconductor foundry, uses the mask (or masks) fabricated by the mask house 220 to fabricate the IC device 240. The IC manufacturer 230 may be an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 240.

The semiconductor wafer may include a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes.

Referring now to FIGS. 3A-3B and 4A-4B in conjunction with FIGS. 1 and 2, simplified block diagrams illustrate aspects of an OPC process in accordance with embodiments of the present disclosure. For example, OPC 270 described above with respect to FIG. 2 may perform the method 100 described above with respect to FIG. 1.

Figure 3A:
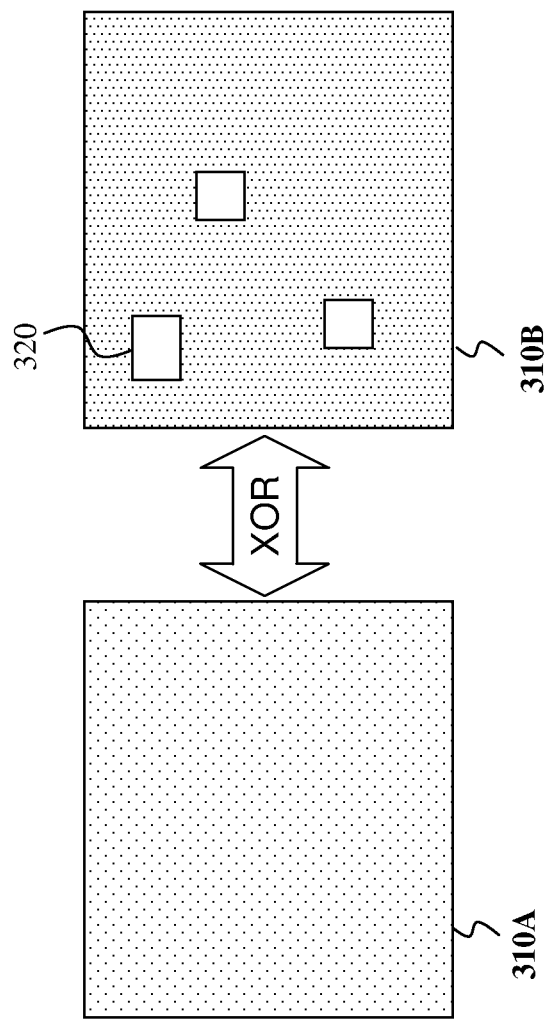
FIGS. 3A-3B and FIG. 4A-4B illustrate simplified block diagrams of aspects of an optical proximity correction (OPC) process in accordance with embodiments of the present disclosure.

FIG. 3A illustrates an example of comparing an initial IC design layout 310A to a revised IC design layout 310B to identify a difference region 320 of the revised IC design layout 310B from the initial IC design layout. Difference region 320 may include one or more regions, as illustrated in FIG. 3A. According to one aspect of the present disclosure, the revised IC design layout 310B is compared to the initial IC design layout 310A by an exclusive or (XOR) logical operation to identify a difference, around which a difference region 320 is formed. The difference region 320 will be used for OPC processing. In one embodiment, the difference region 320 of the revised IC design layout may include a boundary patch that includes portions of the initial IC design layout 310A to avoid gaps when merging the OPC-processed difference region. In other words, difference region 320 may be larger than the difference determined by the XOR operation by a boundary patch around the difference.

Figure 3B:
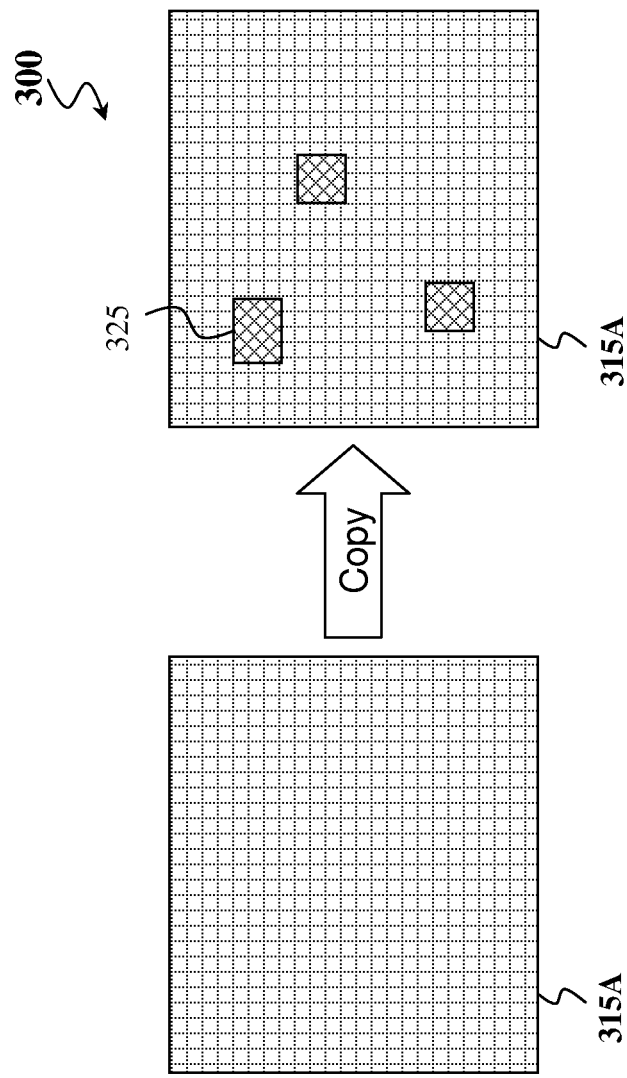

FIG. 3B illustrates an example of performing an OPC on the difference region 320 of the revised IC design layout 310B to provide an OPC-processed difference region 325 of the revised IC design layout and then merging the OPC-processed difference region 325 with the OPC-processed initial IC design layout 315A to provide a merged OPC-processed revised IC design layout 300. The OPC-processed difference region 325 is properly aligned with OPC-processed initial IC design layout 315A and after a merger, alignment quality assurance processes may be applied.

Figure 4A:
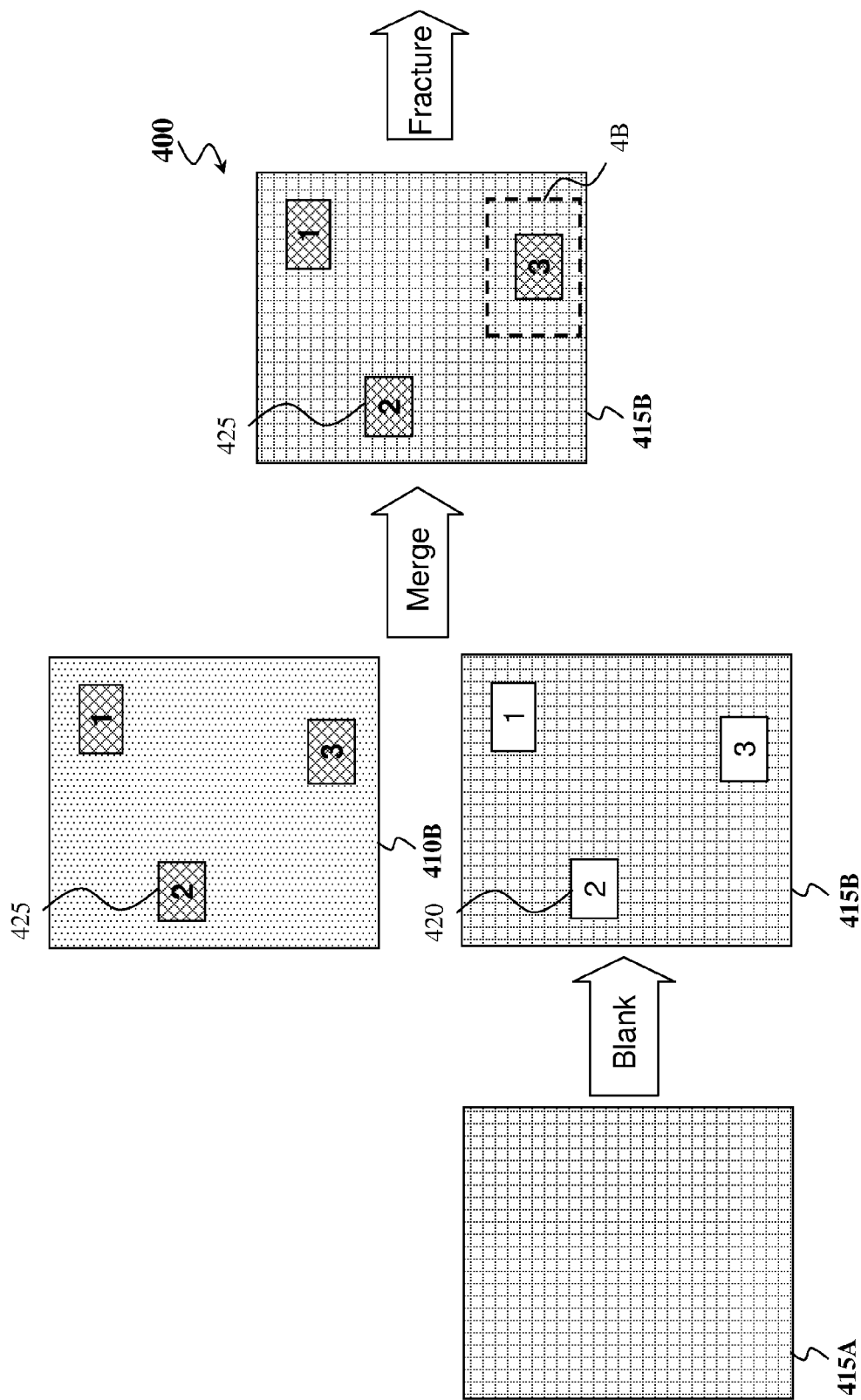
Figure 4B:
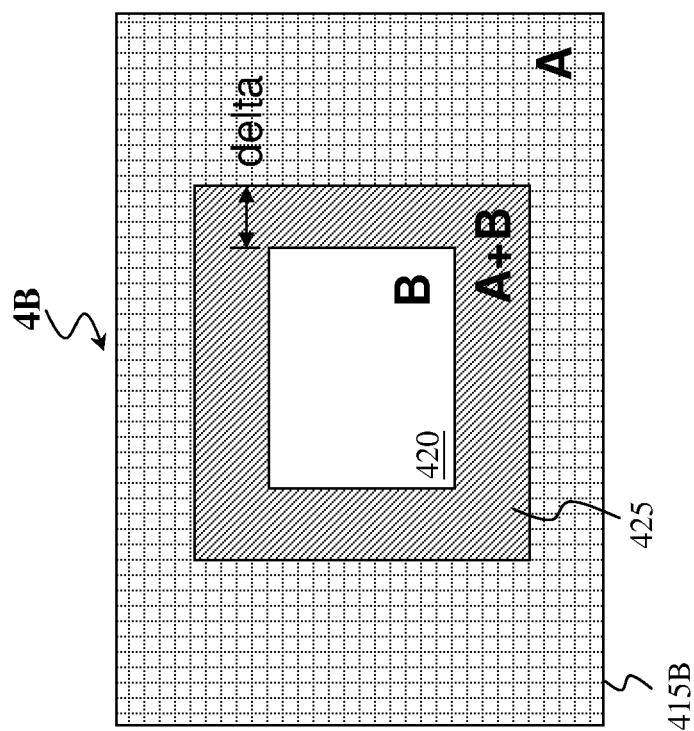

FIGS. 4A and 4B illustrate further illustrate aspects of an OPC process in accordance with embodiments of the present disclosure. According to one aspect of the present disclosure, a difference 420 of the revised IC design layout is removed from an OPC-processed initial IC design layout 415A to provide an OPC-processed initial IC design layout 415B. OPC-processed difference region 425 of a revised IC design layout 410B is then merged with OPC-processed initial IC design layout 415B to provide a merged OPC-processed revised IC design layout 400.

FIG. 4B illustrates an enlarged section of the merged OPC-processed revised IC design layout 400. As noted above, in one embodiment, the OPC-processed difference region 425 of the revised IC design layout may include a boundary patch (A+B) that includes portions of the initial IC design layout (A) to avoid gaps when merging the OPC-processed difference region 425 over a difference 420 (B) of the revised IC design layout. In other words, OPC-processed difference region 425 may be larger than the difference 420 determined by the XOR operation by a boundary patch (A+B) around the difference 420 (B). The boundary patch (A+B) may be a delta from difference 420 by about 1 micron in one example. Other delta lengths are within the scope of the present disclosure.

A fracturing process may then be performed on the merged OPC-processed revised IC design layout 400. Various other post-OPC processes may be performed, including but not limited to performing an alignment check of the boundary patch of the merged difference region of the revised IC design layout, and performing a lithographic process check of the boundary patch.

Advantageously, OPC processing is performed on the identified difference regions (e.g., difference region 320 or difference 420) of the revised IC design layout and not across the entire revised IC design layout, saving time and money. In particular, data preparation cycle time (e.g., OPC cycle time) is relatively reduced while maintaining quality assurance. In other words, OPC processing is performed on select or filtered regions of the revised IC design layout, and then the OPC-processed difference region is merged with a prior OPC-processed initial IC design layout, significantly reducing the size of the data processed and data preparation cycle time.

Figure 5:
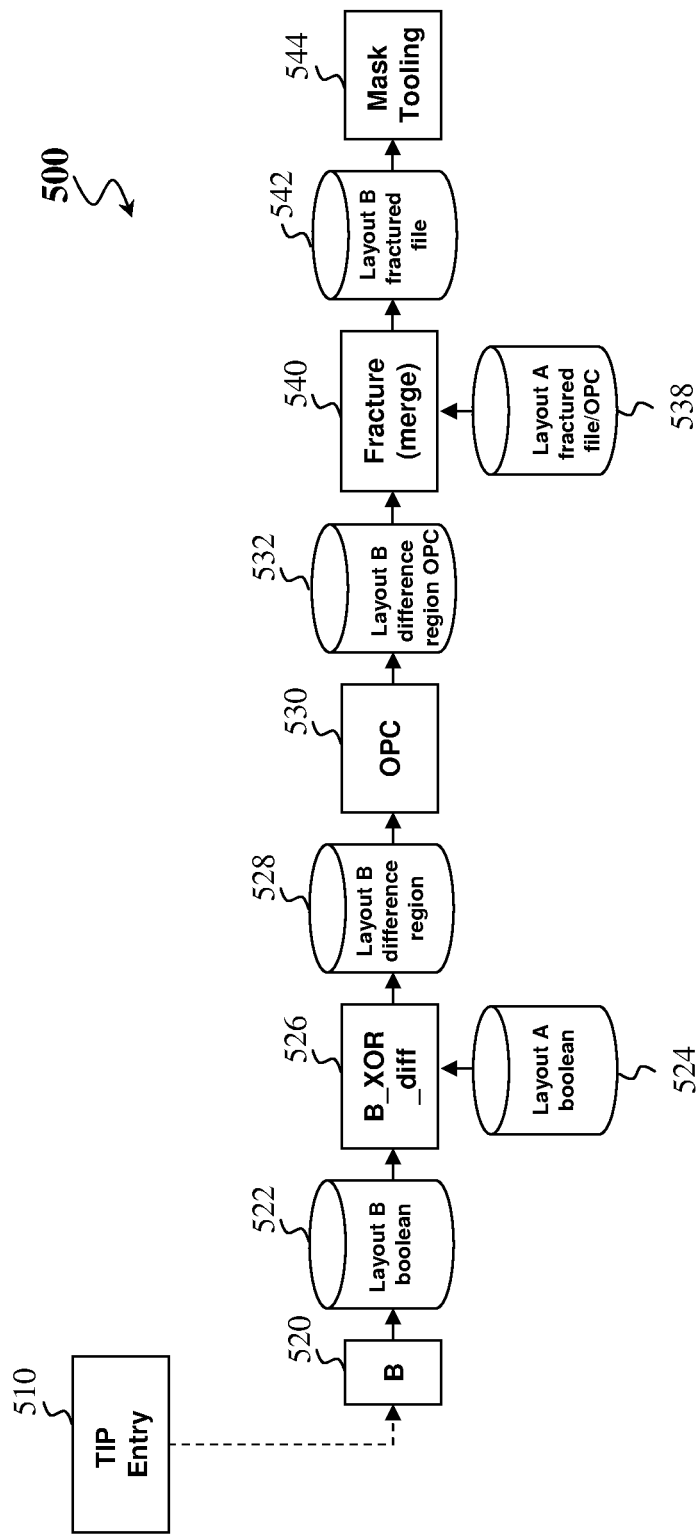
FIG. 5 illustrates a simplified block diagram of an embodiment of an OPC process flow in accordance with embodiments of the present disclosure.

Referring now to FIG. 5, a simplified block diagram illustrates an embodiment of an OPC process flow 500 in accordance with embodiments of the present disclosure. The OPC process flow 500 can be implemented by the IC manufacturing system 200, for example, in the mask data preparation process.

The data preparation process may be initiated at tape-in or TIP entry 510, e.g., on supply of a GDS-II IC design from a design house, for a revised IC design layout B from an initial IC design layout A. TIP entry 510 may include performing a customer engineer (CE) entry stage, for example, including a specification of the number of layers, mask naming, and the like. A dummy stage may also be performed during which dummy structures are specified for the IC design. Upon completion of the dummy stage, a load database tape (LDT) stage may be performed. The load database tape stage may comprise a quality control stage to evaluate a tape-out document.

After completion of the TIP entry 510, a Boolean stage 520 may then be performed on layout B to provide design retuning based on the wafer manufacturing capabilities of the fab to be used for the wafer production. A layout B Boolean database 522 is then provided.

A comparison of the revised IC design layout B Boolean 522 to the initial IC design layout A Boolean 524 is then performed as described above, for example, by an exclusive or (XOR) logical operation 526 to identify a difference region in the revised IC design layout B from the initial IC design layout A. The difference region is provided in layout B difference region database 528.

OPC processing 530 is then provided on the difference region from database 528 as described above. For example, OPC process 530 may include a rule-based OPC, a model-based OPC, or a hybrid OPC. Advantageously, OPC processing is performed on the identified difference regions (e.g., difference region 320 or difference 420) of the revised IC design layout and not across the entire revised IC design layout, significantly reducing the size of the data processed and data preparation cycle time (e.g., in particular OPC cycle time) while maintaining quality assurance. In other words, OPC processing is performed on select or filtered regions of the revised IC design layout, reducing the data size to be processed and the data processing time. OPC-processed difference regions are then stored in database 532.

The OPC-processed difference region in database 532 is then merged with a prior OPC-processed initial IC design layout A or a prior fractured initial IC design layout A 538 to provide a merged OPC-processed revised IC design layout B, which is fractured at fracture processing 540. A fractured OPC-processed revised IC design layout B ready for mask tooling is stored in a database 542.

The fractured OPC-processed revised IC design layout B from database 542 may then be further processed as described above. For example, various post-OPC processes may be applied, including but not limited to a lithographic process check (LPC) that simulates processing that will be implemented by the IC manufacturer 230 to fabricate the IC device 240, and various quality assurance processes (e.g., difference region alignment quality assurance and LPC check of boundary regions, XOR, CRC). LPC may simulate this processing based on the modified IC design layout to create a simulated manufactured device. The simulated manufactured device may be all or a portion of the IC design layout.

The fractured OPC-processed revised IC design layout B (which may be further processed by post-OPC processes) from database 542 may then be sent to mask tooling 544 as described above.

The various steps in flow 500 described above may be performed by various techniques, means, apparatus, and/or systems. It should be noted that the operations of flow 500 may be rearranged or otherwise modified within the scope of the various aspects of the present disclosure. It is further noted that additional processes may be provided before, during, and after the operations of flow 500, and that some other processes may only be briefly described herein. Thus, other implementations are possible within the scope of the various aspects described herein.

For example, in one embodiment, a checkpoint at TIP entry 510 may include analysis of the revised IC design layout B in comparison to initial IC design layout A, including but not limited to a check for LOP script change, OPC version change, OPC recipe change, and the like. If the revised IC design layout B is similar enough to initial IC design layout A such that there is no LOP script change, no OPC version change, no OPC recipe change, and so forth, the checkpoint may pass and process 500 may continue. If the checkpoint does not pass, then process 500 may stop.

In another embodiment, another checkpoint may be provided prior to OPC processing 530. This checkpoint may include determining a ratio of an area of the difference region and an area of the revised IC design layout, and then performing the OPC 530 on the difference region of the revised IC design layout only if the ratio is below a threshold (e.g., a specified percentage). If the ratio is above the threshold, the OPC process flow 500 may stopped.

In yet another embodiment, after OPC-processed difference regions are stored in database 532, an OPC trim or boundary patch may be added to the OPC-processed difference regions as described above. The modified OPC-processed difference regions including a trim or boundary patch may be stored in a database, which are then merged with a prior OPC-processed initial IC design layout A or a prior fractured initial IC design layout A 538 to provide a merged OPC-processed revised IC design layout B, which is fractured at fracture processing 540.

In accordance with an embodiment, various pre-OPC processes and/or post-OPC processes described above may be performed in parallel to advantageously reduce the data preparation duration during mask design data preparation.

The present disclosure is designed to work on any specific architecture. For example, the mask manufacturing system and method system may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

Furthermore, embodiments of the present disclosure can include one or more databases, which can include any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet.

Figure 6:
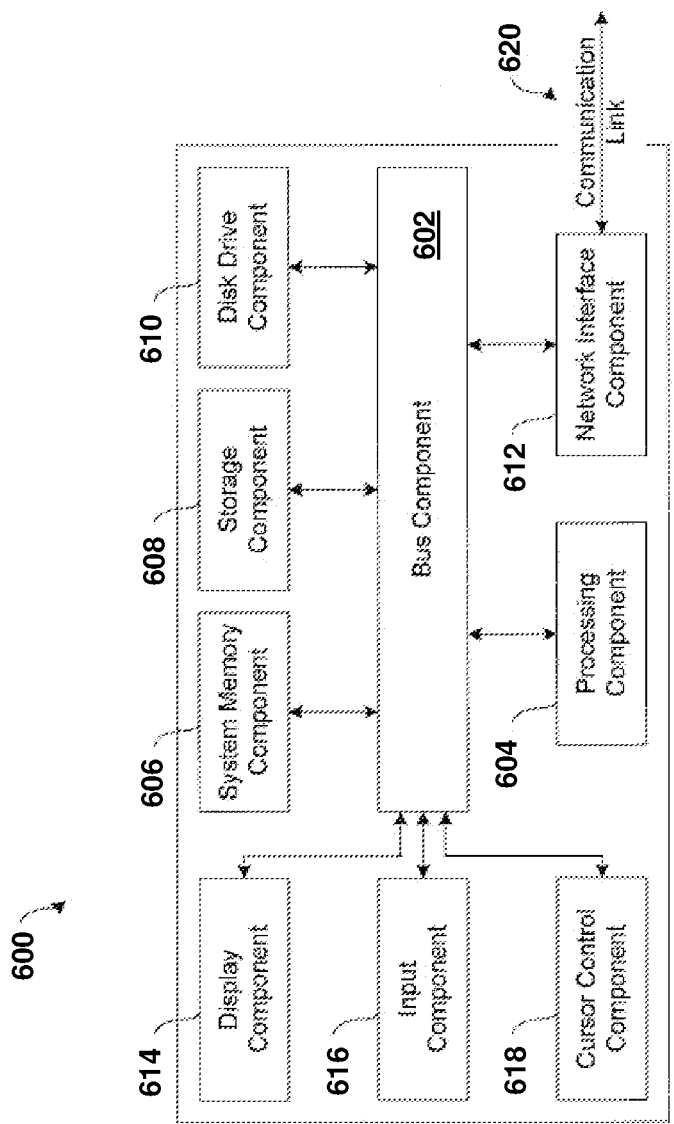
FIG. 6 is a block diagram of a computer system suitable for implementing one or more embodiments of the present disclosure.

Referring now to FIG. 6, a block diagram is illustrated of a computer system 600 suitable for implementing one or more embodiments of the present disclosure at least in part, including method 100 and the OPC processing to reduce cycle time of data preparation described above. In one example, computer system 600 is suitable for data preparation at least in part, including applying OPC, fracturing data, and verifying data, and/or is suitable for mask tooling at least in part.

In accordance with various embodiments of the present disclosure, computer system 600, such as a data preparation computer and/or masking tool, includes a bus 602 or other communication mechanism for communicating information, which interconnects subsystems and components, such as processing component 604 (e.g., processor, micro-controller, digital signal processor (DSP), etc.), system memory component 606 (e.g., RAM), static storage component 608 (e.g., ROM), disk drive component 610 (e.g., magnetic or optical), network interface component 612 (e.g., modem or Ethernet card), display component 614 (e.g., CRT or LCD), input component 616 (e.g., keyboard, touch screen), and cursor control component 618 (e.g., mouse or trackball). In one implementation, disk drive component 610 may comprise a database having one or more disk drive components.

In accordance with embodiments of the present disclosure, computer system 600 performs specific operations by processor 604 executing one or more sequences of one or more instructions contained in system memory component 606. Such instructions may be read into system memory component 606 from another computer readable medium, such as static storage component 608 or disk drive component 610. In other embodiments, hard-wired circuitry may be used in place of or in combination with software instructions to implement the present disclosure. In one example, processor 604 is configured to receive and access initial IC design layout data, receive and access revised IC design layout data, identify difference regions between the initial and revised IC design layout data, perform OPC on the difference region, merge OPC-processed difference regions, and/or perform fracturing processes. Processor 604 is further configured to receive instructions from other components of computer system 600 (e.g., even from a network through network interface component 612).

Logic may be encoded in a computer readable medium, which may refer to any medium that participates in providing instructions to processor 604 for execution. Such a medium may take many forms, including but not limited to, non-volatile media, volatile media, and transmission media. In various implementations, non-volatile media includes optical or magnetic disks, such as disk drive component 610, volatile media includes dynamic memory, such as system memory component 606, and transmission media includes coaxial cables, copper wire, and fiber optics, including wires that comprise bus 602. In one example, transmission media may take the form of acoustic or light waves, such as those generated during radio wave and infrared data communications.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice embodiments of the present disclosure may be performed by computer system 600. In various other embodiments of the present disclosure, a plurality of computer systems 600 coupled by communication link 620 (e.g., a communications network, such as a LAN, WLAN, PTSN, and/or various other wired or wireless networks, including telecommunications, mobile, and cellular phone networks) may perform instruction sequences to practice the present disclosure in coordination with one another.

Computer system 600 may transmit and receive messages, data, information and instructions, including one or more programs (i.e., application code) through communication link 620 and communication interface 612. Received program code may be executed by processor 604 as received and/or stored in disk drive component 610 or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Advantageously, the time required for performing data preparation associated with a mask design in accordance with embodiments of the present disclosure is reduced with respect to conventional mechanisms in which OPC processing is performed over an entire layout or chip area for a revised IC design layout.

Thus, the present disclosure provides for various embodiments. According to one embodiment, a method of reducing cycle time in data preparation is provided. The method includes receiving an initial integrated circuit (IC) design layout and an optical proximity correction (OPC)-processed initial IC design layout, and receiving a revised IC design layout. The method further includes comparing the revised IC design layout to the initial IC design layout to identify a difference region of the revised IC design layout from the initial IC design layout, performing an OPC on the difference region of the revised IC design layout, and merging the OPC-processed difference region of the revised IC design layout with the OPC-processed initial IC design layout.

In another embodiment, a method includes receiving an initial integrated circuit (IC) design layout and an optical proximity correction (OPC)-processed initial IC design layout, and receiving a revised IC design layout. The method further includes comparing the revised IC design layout to the initial IC design layout by an exclusive or (XOR) logical operation to identify a difference region of the revised IC design layout from the initial IC design layout, performing an OPC on the difference region of the revised IC design layout, merging the OPC-processed difference region of the revised IC design layout with the OPC-processed initial IC design layout to provide a merged OPC-processed revised IC design layout, and fracturing the merged OPC-processed revised IC design layout.

In yet another embodiment, a non-transitory computer-readable medium having instructions embodied thereon is provided. The instructions are executable by a processor to perform a method comprising: receiving an initial integrated circuit (IC) design layout and an optical proximity correction (OPC)-processed initial IC design layout; receiving a revised IC design layout; comparing the revised IC design layout to the initial IC design layout to identify a difference region of the revised IC design layout from the initial IC design layout; performing an OPC on the difference region of the revised IC design layout; and merging the OPC-processed difference region of the revised IC design layout with the OPC-processed initial IC design layout.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of reducing cycle time in data preparation, the method comprising:
    receiving an initial integrated circuit (IC) design layout and an optical proximity correction (OPC)-processed initial IC design layout;
    receiving a revised IC design layout;
    comparing, by a processor, the revised IC design layout to the initial IC design layout to identify a difference region of the revised IC design layout from the initial IC design layout;
    performing, by a processor, an OPC on the difference region of the revised IC design layout; and
    merging, by a processor, the OPC-processed difference region of the revised IC design layout with the OPC-processed initial IC design layout.

2. The method of claim 1, wherein the revised IC design layout is compared to the initial IC design layout by an exclusive or (XOR) logical operation.

3. The method of claim 1, wherein the OPC performed on the difference region of the revised IC design layout is a rule-based OPC, a model-based OPC, or a combination thereof.

4. The method of claim 1, further comprising determining a ratio of an area of the difference region and an area of the revised IC design layout.

5. The method of claim 4, wherein the OPC on the difference region of the revised IC design layout is performed if the ratio is below a threshold.

6. The method of claim 1, further comprising:
identifying a difference region of the initial IC design layout from the revised IC design layout; and
removing the difference region of the initial IC design layout from the OPC-processed initial IC design layout.

7. The method of claim 1, further comprising:
performing an alignment check of a boundary patch around the merged difference region of the revised IC design layout; and
performing a lithographic process check of the boundary patch.

8. The method of claim 1, wherein merging the OPC-processed difference region of the revised IC design layout with the OPC-processed initial IC design layout provides a merged OPC-processed revised IC design layout, and
further comprising fracturing of the merged OPC-processed revised IC design layout.

9. A method of reducing cycle time in data preparation, the method comprising:
receiving an initial integrated circuit (IC) design layout and an optical proximity correction (OPC)-processed initial IC design layout;
receiving a revised IC design layout;
comparing, by a processor, the revised IC design layout to the initial IC design layout by an exclusive or (XOR) logical operation to identify a difference region of the revised IC design layout from the initial IC design layout;
performing, by a processor, an OPC on the difference region of the revised IC design layout;
merging, by a processor, the OPC-processed difference region of the revised IC design layout with the OPC-processed initial IC design layout to provide a merged OPC-processed revised IC design layout; and
fracturing the merged OPC-processed revised IC design layout.

10. The method of claim 9, wherein the OPC performed on the difference region of the revised IC design layout is a rule-based OPC, a model-based OPC, or a combination thereof.

11. The method of claim 9, further comprising determining a ratio of an area of the difference region and an area of the revised IC design layout.

12. The method of claim 11, wherein the OPC on the difference region of the revised IC design layout is performed if the ratio is below a threshold.

13. The method of claim 9, further comprising:
identifying a difference region of the initial IC design layout from the revised IC design layout; and
removing the difference region of the initial IC design layout from the OPC-processed initial IC design layout.

14. The method of claim 9, further comprising:
performing an alignment check of a boundary patch around the merged difference region of the revised IC design layout; and
performing a lithographic process check of the boundary patch.

15. A non-transitory computer-readable medium having instructions embodied thereon, the instructions executable by a processor to perform a method comprising:
receiving an initial integrated circuit (IC) design layout and an optical proximity correction (OPC)-processed initial IC design layout;
receiving a revised IC design layout;
comparing the revised IC design layout to the initial IC design layout to identify a difference region of the revised IC design layout from the initial IC design layout;
performing an OPC on the difference region of the revised IC design layout; and
merging the OPC-processed difference region of the revised IC design layout with the OPC-processed initial IC design layout.

16. The non-transitory computer-readable medium of claim 15, wherein the revised IC design layout is compared to the initial IC design layout by an exclusive or (XOR) logical operation.

17. The non-transitory computer-readable medium of claim 15, wherein the method further comprises:
determining a ratio of an area of the difference region and an area of the revised IC design layout; and
performing the OPC on the difference region of the revised IC design layout only if the ratio is below a threshold.

18. The non-transitory computer-readable medium of claim 15, wherein the method further comprises:
identifying a difference region of the initial IC design layout from the revised IC design layout; and
removing the difference region of the initial IC design layout from the OPC-processed initial IC design layout.

19. The non-transitory computer-readable medium of claim 15, wherein the method further comprises:
performing an alignment check of a boundary patch around the merged difference region of the revised IC design layout; and
performing a lithographic process check of the boundary patch.

20. The non-transitory computer-readable medium of claim 15, wherein merging the OPC-processed difference region of the revised IC design layout with the OPC-processed initial IC design layout provides a merged OPC-processed revised IC design layout, and
wherein the method further comprises fracturing of the merged OPC-processed revised IC design layout.

* * * * *